(12) United States Patent
Werner et al.

(10) Patent No.: US 8,048,736 B2
(45) Date of Patent: Nov. 1, 2011

(54) SEMICONDUCTOR DEVICE COMPRISING A CAPACITOR IN THE METALLIZATION SYSTEM AND A METHOD OF FORMING THE CAPACITOR

(75) Inventors: Thomas Werner, Reichenberg (DE); Frank Feustel, Dresden (DE); Kai Frohberg, Niederau (DE)

(73) Assignee: Advanced Micro Devices, Inc., Austin, TX (US)

( * ) Notice: Subject to any disclaimer, the term of this patent is extended or adjusted under 35 U.S.C. 154(b) by 104 days.

(21) Appl. No.: 12/173,268

(22) Filed: Jul. 15, 2008

(65) Prior Publication Data

US 2009/0194845 A1 Aug. 6, 2009

(30) Foreign Application Priority Data

Jan. 31, 2008 (DE) .................. 10 2008 006 962

(51) Int. Cl.
*H01L 23/52* (2006.01)
(52) U.S. Cl. . 438/253; 257/211; 257/306; 257/E21.011; 257/E23.145
(58) Field of Classification Search .................. 438/253; 257/211, E23.145, 306, E21.011
See application file for complete search history.

(56) References Cited

U.S. PATENT DOCUMENTS

| | | | |
|---|---|---|---|
| 6,211,068 B1* | 4/2001 | Huang | 438/634 |
| 6,734,489 B2* | 5/2004 | Morimoto et al. | 257/306 |
| 6,759,703 B1 | 7/2004 | Matsuhashi | 257/306 |
| 7,056,787 B2 | 6/2006 | Chang et al. | 438/253 |
| 7,187,015 B2 | 3/2007 | Tsau | 257/211 |
| 2001/0034135 A1* | 10/2001 | Miyakawa | 438/710 |
| 2003/0194840 A1* | 10/2003 | Murata | 438/241 |
| 2005/0275005 A1 | 12/2005 | Choi et al. | 257/300 |
| 2006/0124987 A1* | 6/2006 | Won et al. | 257/310 |
| 2007/0080426 A1* | 4/2007 | Matz et al. | 257/516 |

OTHER PUBLICATIONS

Translation of Official Communication from German Patent Office for German Patent Application No. 10 2008 006 962.0 dated Aug. 27, 2008.

* cited by examiner

*Primary Examiner* — Wael Fahmy
*Assistant Examiner* — John C Ingham
(74) *Attorney, Agent, or Firm* — Williams, Morgan & Amerson, P.C.

(57) ABSTRACT

By forming metal capacitors in the metallization structures of semiconductor devices, complex manufacturing sequences in the device level may be avoided. The process of manufacturing the metal capacitors may be performed on the basis of well-established patterning regimes of modern metallization systems by using appropriately selected etch stop materials, which may enable a high degree of compatibility for forming via openings in a metallization layer while providing a capacitor dielectric of a desired high dielectric constant in the capacitor.

17 Claims, 7 Drawing Sheets

SEMICONDUCTOR DEVICE COMPRISING A CAPACITOR IN THE METALLIZATION SYSTEM AND A METHOD OF FORMING THE CAPACITOR

BACKGROUND OF THE INVENTION

1. Field of the Invention

The present disclosure generally relates to the field of fabricating integrated circuits, and, more particularly, to forming capacitors in the metallization system, such as capacitors for dynamic random access memories (DRAMs), decoupling capacitors and the like.

2. Description of the Related Art

In modern integrated circuits, a very high number of individual circuit elements, such as field effect transistors in the form of CMOS, NMOS and PMOS elements, resistors, capacitors and the like are formed on a single chip area. Typically, feature sizes of these circuit elements are steadily decreasing with the introduction of every new circuit generation to provide currently available integrated circuits with an improved degree of performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance while, however, increasing dynamic power consumption of the individual transistors. That is, due to the reduced switching time period, the transient currents, upon switching a CMOS transistor element from logic low to logic high, are significantly increased.

In addition to the large number of transistor elements, a plurality of passive circuit elements, such as capacitors, are typically formed in integrated circuits that are used for a plurality of purposes, such as for decoupling. Decoupling in integrated circuits is an important aspect for reducing the switching noise of the fast switching transistors, since the decoupling capacitor may provide energy at a specific point of the circuitry, for instance, at the vicinity of a fast switching transistor, and thus reduce voltage variations which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC). Furthermore, in sophisticated microcontroller devices, an increasing amount of storage capacity may be provided on chip with the CPU core, thereby also significantly enhancing the overall performance of modern computer devices. For example, in typical microcontroller designs, different types of storage devices may be incorporated to provide an acceptable compromise between die area consumption and information storage density versus operating speed. For instance, fast or temporary memories, so-called cache memories, may be provided in the vicinity of the CPU core, wherein respective cache memories may be designed to allow reduced access times compared to external storage devices. Since a reduced access time for a cache memory may typically be associated with a reduced storage density thereof, the cache memories may be arranged according to a specified memory hierarchy, wherein a level 1 cache memory may represent the memory formed in accordance with the fastest available memory technology. For example, static RAM memories may be formed on the basis of registers, thereby enabling an access time determined by the switching speed of the corresponding transistors in the registers. Typically, a plurality of transistors may be required to implement a corresponding static RAM cell. In currently practiced approaches, up to six transistors may typically be used for a single RAM memory cell, thereby significantly reducing the information storage density compared to, for instance, dynamic RAM memories including a storage capacitor in combination with a pass transistor. Thus, a higher information storage density may be achieved with DRAMs, although at an increased access time compared to static RAMs, which may render dynamic RAMs attractive for specific, less time-critical applications in complex semiconductor devices. For example, typical cache memories of level 3 may be implemented in the form of dynamic RAM memories so as to enhance information density within the CPU, while only moderately sacrificing overall performance.

Frequently, the storage capacitors may be formed in the transistor level using a vertical or planar configuration. While the planar architecture may require significant silicon area for obtaining the required capacitance values, the vertical arrangement may necessitate complex patterning regimes for forming the trenches of the capacitors. Consequently, the respective trenches for accommodating an appropriate capacitor dielectric and capacitor electrode materials may have to extend deeply into the semiconductor material to provide the desired high capacitance. For example, for advanced semiconductor devices including an embedded DRAM area, a depth of up to 8 µm may be required with respect to achieving the required capacitance. The etch process for forming deep trenches therefore represents highly critical process steps during the formation of embedded DRAM areas, since the precise depth, the sidewall angles and the like may essentially influence the finally obtained performance of the respective capacitors.

Consequently, sophisticated etch processes on the basis of appropriate plasma ambients have been established for silicon-based transistors with a bulk configuration, in which the active region of the transistor is electrically connected to the substrate material. During a corresponding anisotropic etch process, an appropriate plasma atmosphere is generated in which reactive ions are created and are accelerated towards the surface to be etched in order to obtain a high directionality for providing a moderately high physical component, which is substantially oriented perpendicular to the surface of interest. Furthermore, respective polymer materials may be added to the etch ambient of the respective anisotropic etch process in order to appropriately reduce a lateral etch component, while substantially not affecting the vertical progress of the corresponding etch front. Due to the highly complex conditions within the plasma etch ambient, which may even alter with the height level within the opening, highly stable process conditions are required to achieve a uniform process result. In particular, since a high degree of directionality has to be maintained within the etch opening during the ongoing etch process, the bias voltage applied between the plasma ambient and the substrate represents a critical process parameter, which may significantly affect the etch rate and also the degree of directionality, in particular if deep trenches up to 8 µm may have to be etched. Typically, the respective bias voltage may be established on the basis of a DC voltage source or on the basis of RF (radio frequency) bias generators, which may be controlled with high accuracy. However, the actually effective bias voltage at the substrate is substantially determined by the local conditions of the substrate to be etched, wherein, in particular, conductive areas of extended size may significantly reduce the effect of the external bias voltage sources when the corresponding areas may not be tied to a defined potential. This may be accomplished in a bulk configuration by connecting the substrate with the external bias voltage source, thereby also creating the same potential in the respective regions of the substrate material in which the deep trench is to be formed.

In SOI architectures, which are frequently used in sophisticated semiconductor devices, the active semiconductor layer is electrically insulated from the substrate portion, thereby resulting in significantly different etch conditions, which may result in even more complex process conditions. Hence, a high capacitance value in the transistor level may require large area and/or very complex manufacturing techniques.

For these reasons, in some approaches, capacitors may be formed in the metallization level of semiconductor devices, thereby avoiding the complex process sequence in the transistor level described above. However, in advanced semiconductor devices formed on the basis of highly conductive metals, such as copper, possibly in combination with low-k dielectric materials, the additional processes and materials used for the capacitor may also affect other components in the metallization level, thereby possibly also compromising performance of the metallization level system.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which capacitors, such as decoupling capacitors, storage elements for dynamic RAM areas and the like, may be provided within the metallization system of the semiconductor device without unduly affecting other components of the metallization structure. For this purpose, in some illustrative aspects, well-established patterning regimes for sophisticated metallization systems may be used, for instance inlaid techniques, wherein one capacitor electrode may be patterned commonly with other metal regions, such as metal lines, in one metallization layer, while a second capacitor electrode may be formed in accordance with inlaid techniques with a high degree of compatibility with conventional manufacturing processes for forming metallization structures. To this end, an appropriately designed etch stop layer stack may be used to enable the formation of via openings extending to a lower metallization level, and of capacitor openings which may be separated from the respective capacitor electrode in the lower-lying metallization level by an appropriate dielectric material acting as a capacitor dielectric. In other illustrative aspects disclosed herein, the capacitor dielectric material may be formed during an appropriate manufacturing stage when forming via openings and trenches for metal lines, wherein, also in this case, the capacitor dielectric may act as an etch stop material during the further processing for forming the via opening so as to connect to the underlying metal region. Consequently, the metallization level may be efficiently used for the accommodation of capacitors wherein the capacitance may be readily adjusted by appropriately selecting the lateral dimensions of the respective metal regions in combination with providing an appropriate dielectric material, which may have a significantly higher value compared to other dielectric materials as may typically be used in advanced metallization structures. Consequently, the area consumption caused by the provision of a plurality of capacitors, for instance for providing storage elements for extended DRAM areas, may be reduced by appropriately distributing the capacitors within the metallization structure, possibly across several metallization levels, while not unduly contributing to the overall process complexity and also significantly reducing any negative effects on other metallization features.

One illustrative method disclosed herein comprises forming an etch stop layer stack above the first metallization layer of a semiconductor device, wherein the etch stop layer stack comprises a first etch stop layer and a second etch stop layer and wherein the first metallization layer comprises a first metal region and a second metal region. The method further comprises forming an interlayer dielectric material above the etch stop layer stack and forming a first opening in the interlayer dielectric material above the first metal region, wherein the first opening extends through the first and second etch stop layers. The method additionally comprises forming a second opening in the interlayer dielectric material above the second metal region, wherein the second opening extends to the first etch stop layer. Furthermore, the method comprises filling the first and second openings with a metal-containing material in a common fill process.

A further illustrative method disclosed herein relates to the formation of a capacitive structure in a metallization structure of a semiconductor device. The method comprises forming a via opening and a capacitor opening in a dielectric layer by performing a first etch process. Additionally, the method comprises controlling at least one process parameter of the first etch process to stop the material removal in the via opening on the basis of an etch stop layer, while substantially completely removing the etch stop layer in the capacitor opening to expose a capacitor electrode. Moreover, the method comprises forming a dielectric material on an exposed surface of the capacitor electrode and removing the etch stop layer in the via opening to expose a metal region. Additionally, the method comprises filling the via opening and the capacitor opening with a metal-containing material in a common process sequence.

One illustrative semiconductor device disclosed herein comprises a first metallization layer comprising a first interlayer dielectric material and a first metal region embedded in the first interlayer dielectric material, wherein the first metal region represents a first capacitor electrode. The semiconductor device further comprises a second metallization layer formed above the first metallization layer and comprising a second interlayer dielectric material formed above the first dielectric material, wherein the second metallization layer comprises a second metal region located above the first metal region and representing a second capacitor electrode. Moreover, a first dielectric material is provided and represents a capacitor dielectric that separates the first and second metal regions. Additionally, the semiconductor device comprises a second dielectric material located between the first and second interlayer dielectric materials.

BRIEF DESCRIPTION OF THE DRAWINGS

The disclosure may be understood by reference to the following description taken in conjunction with the accompanying drawings, in which like reference numerals identify like elements, and in which.

Figure 1A:
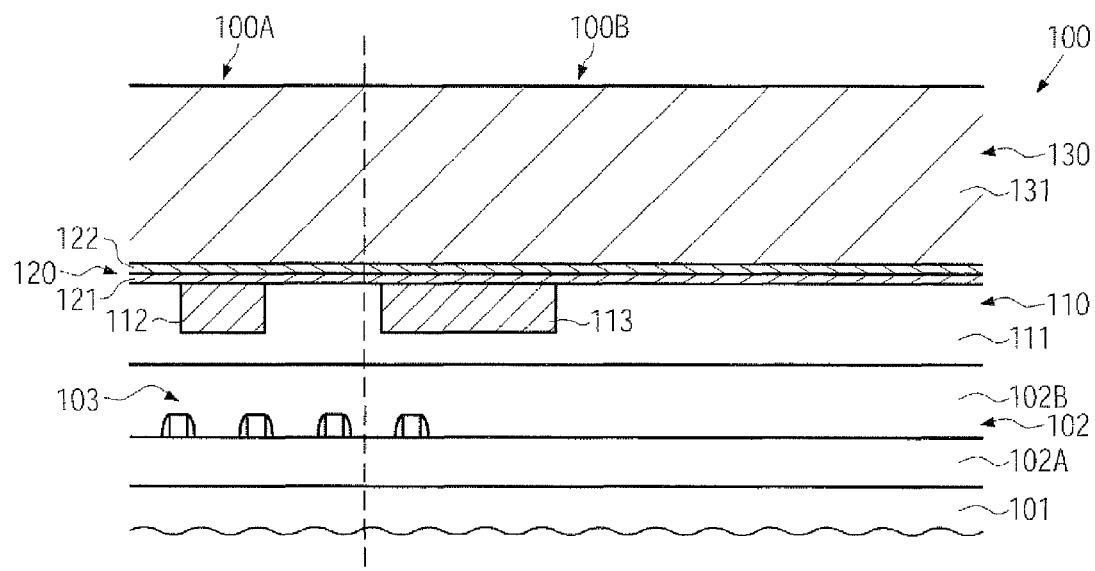
FIGS. 1a-1f schematically illustrate cross-sectional views of a semiconductor device including a metallization system during various manufacturing stages in forming a capacitor in the metallization structure on the basis of two different etch stop layers, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the methods and semiconductor devices disclosed herein relate to a process technique in which capacitors, such as decoupling capacitors, storage elements for memory areas in sophisticated semiconductor devices and the like, may be formed in the metallization level of the semiconductor device while providing a high degree of compatibility with conventional manufacturing techniques and maintaining any impact of the materials and process steps required for providing the capacitor electrodes with respect to other components at a low level. For this purpose, in some illustrative embodiments disclosed herein, an appropriately designed layer stack may be formed between the dielectric materials of adjacent metallization layers, thereby enabling the patterning of via openings connecting to a lower-lying metal region, while at the same time providing a desired dielectric material between a metal region of the lower-lying metallization layer and a metal region of the adjacent metallization layer, thereby providing a capacitor dielectric material. Due to the provision of the etch stop layer stack, well-established process techniques, i.e., the patterning of interlayer dielectric materials, such as low-k dielectric materials and the like, may be used while not unduly affecting the characteristics and performance of other metal features. That is, an appropriate capacitor dielectric may be provided within the etch stop layer stack with a well-defined thickness and material composition to obtain the desired capacitance value, while the overall permittivity in the vicinity of "regular" metal lines may not be substantially significantly compromised, while a high degree of uniformity may also be accomplished.

In still other illustrative embodiments disclosed herein, the influence of a capacitor dielectric material of high permittivity may be restricted to specific device areas, such as RAM areas, or may even be restricted to the immediate neighborhood of the respective capacitor electrodes, by appropriately patterning the etch stop materials prior to the deposition of the interlayer dielectric material of the subsequent metallization layer. Thus, the actual patterning of the via openings, the trenches and the capacitor openings may be accomplished based on a process sequence having a high degree of compatibility with conventional manufacturing processes for forming metal lines and vias, thereby contributing to reducing process complexity while at the same time maintaining the overall permittivity of metal lines and vias at a low level. In still other illustrative embodiments, etch stop layer stacks with a plurality of different material layers may be used to enhance the overall process sequence for patterning layers and trenches on the one hand and appropriately sized capacitor openings on the other hand, while also providing an enhanced degree of flexibility in selecting appropriate high-k dielectric materials, since the required etch selectivity may be achieved on the basis of other material layers in the etch stop layer stack.

In still other illustrative aspects disclosed herein, the capacitor dielectric may be formed after exposing the lower electrode material, which, in some illustrative embodiments, may be accomplished on the basis of a common patterning process for forming vias in other device areas. Thereafter, the patterning of the via may be continued while the capacitor dielectric may act as an efficient etch stop material. Consequently, in this case, the capacitor dielectric may be provided in a local manner, thereby significantly reducing any adverse effects on other device components, while at the same time a highly efficient patterning sequence may be achieved.

Consequently, the capacitors may be incorporated in the metallization structure in a highly efficient manner wherein the "consumption" of precious chip area may be reduced compared to planar capacitor configurations provided in the device level, since the metal regions representing the capacitor electrodes may be laterally shaped in accordance with available space in the respective metallization structures, which may therefore impose less restrictive constraints compared to the positioning of planar capacitors in the device level, wherein also, in some illustrative embodiments, the capacitors may be distributed across a plurality of stacked metallization levels, thereby providing a "three-dimensional" arrangement, which may also contribute to an increased storage density or information density of respective dynamic RAM areas. Moreover, since the manufacturing technique disclosed herein may be highly compatible with process regimes for forming conventional metallization structures of advanced semiconductor devices, enhanced functionality and/or performance may be achieved without requiring significant modifications of the overall manufacturing flow.

FIG. 1a schematically illustrates a cross-sectional view of a semiconductor device 100 which may represent any advanced semiconductor device including a plurality of circuit elements, a part of which may be provided in the form of capacitors which may be formed within a metallization structure of the device 100, as will be explained later on in more detail. The semiconductor device 100 may comprise a substrate 101, which may represent any appropriate carrier material for forming thereabove a device level 102 for forming therein semiconductor circuit elements, such as transistors, capacitors, resistors and the like, as may be required by the circuit layout of the device 100. For convenience, any such circuit elements are indicated by reference number 103, which may be formed in and above an appropriately configured semiconductor layer 102A, which, in combination with a dielectric layer 102B in which at least portions of the circuit elements 103 may be embedded, may define the device level 102. It should be appreciated that the device level 102 may comprise a plurality of isolation structures (not shown), such as shallow trench isolations and the like, and may also include two or more semiconductor levels as may be required for the device 100. For example, the substrate 101, in combination with the device level 102, may define, at least locally, a silicon-on-insulator (SOI) configuration, wherein active regions for transistors and the like may be formed in a semiconductor layer, such as a silicon-containing layer, which may in turn be formed on a buried insulating layer (not shown). Moreover, further circuit elements or portions thereof may be formed in a crystalline area below a respective buried insulating layer, as, for instance, previously explained when referring to vertical storage capacitors in SOI devices. It should therefore be appreciated that the principles disclosed herein should not be construed as being restricted to a specific configuration of the device level 102. Rather, the device level 102 is meant to refer to an area in which semiconductor-based circuit elements are provided.

Furthermore, in the manufacturing stage shown, the semiconductor device 100 may comprise a first metallization layer 110 formed above the device level 102, wherein it should be appreciated that further metallization layers (not shown) may be provided between the device level 102 and the first metallization layer 110. In other illustrative embodiments, the metallization layer 110 may represent the very first metallization level, that is, respective metal regions contained therein may be connected to the circuit elements 103 by means of an appropriate contact structure (not shown), which may be provided within the dielectric material 102B. The metallization layer 110 may comprise a dielectric material 111, which may also be referred to as an interlayer dielectric material, and which may be comprised of any appropriate material, such as silicon dioxide, silicon nitride, silicon oxynitride and the like. In some illustrative embodiments, the dielectric constant of these dielectric materials may be considered inappropriate with respect to parasitic capacitances between adjacent metal regions in the layer 110, and hence so-called low-k dielectric materials may be used for the layer 111, at least partially, wherein a low-k dielectric material may be understood as a material having a dielectric constant k of approximately 3.0 and less. On the other hand, a high-k dielectric material may be understood as a dielectric material having a dielectric constant of approximately 10 or greater.

The metallization layer 110 may further comprise a first metal region 112 and a second metal region 113 which may comprise any appropriate metal, wherein, in advanced applications, highly conductive materials, such as copper, copper alloys and the like, may be used. For example, copper may frequently be used in combination with appropriate barrier materials (not shown), such as tantalum, tantalum nitride, titanium, titanium nitride and the like, thereby confining the copper material with respect to diffusion into the neighboring dielectric material of the layer 111 and in view of suppressing any interaction of reactive species which may be contained in the layer 111 with the copper atoms. In the embodiment shown, the first metal region 112 may represent a "regular" metallization feature, i.e., a metal line and the like, which may be used to interconnect a plurality of the circuit elements 103 in accordance with the circuit layout of the device 100. On the other hand, the metal region 113 may represent a capacitor electrode having appropriate lateral dimensions to define a desired surface area for obtaining a required capacitance value in combination with a capacitor dielectric and a further electrode, as will be explained later on. It should be appreciated that the metal region 113 may have any appropriate lateral configuration so as to obtain an increased surface area while also complying with design constraints with respect to other components in the metallization layer 110, such as the metal region 112 or other capacitor electrodes.

In one illustrative embodiment, the metal region 113 may represent a device area 100B, in which a moderately high "density" of capacitors is to be provided, for instance, in view of providing a high information density for dynamic RAM areas, while another device area 100A may represent an area in which a significantly lower number of capacitors may be required, such as logic circuitry blocks and the like. In other cases, the capacitor electrodes 113 may be distributed across the entire metallization layer 110 in an appropriate manner so as to provide decoupling effects so that the respective electrodes 113 may be provided in the vicinity of fast-switching transistors, as previously explained. It should be appreciated that the capacitor electrodes 113 may be appropriately connected to respective circuit elements, such as pass transistors in memory cells, fast switching transistors and the like, by a correspondingly designed contact structure or lower-lying metallization levels, depending on the overall device configuration. For convenience, any such connections of circuit elements 103 to the capacitor electrode 113 are not shown.

The semiconductor device 100 may further comprise a stack of dielectric materials 120, which may, in some cases, also be referred to as etch stop layer stacks, since two or more of the plurality of individual dielectric materials 121, 122 may act as etch stop materials during the further processing of the device 100. In one illustrative embodiment as shown, the layer stack 120 may comprise two different materials in the form of the layers 121, 122 which may have a different material composition, thereby enabling a selective removal of at least the material 122 with respect to the material 121. In one illustrative embodiment, the first material 121 may have a composition to act as a capacitor dielectric material wherein a moderately high dielectric constant or k value may be advantageously provided. On the other hand, the second dielectric material 122 may have a lower permittivity so that a total permittivity of the layer stack 120 may not unduly affect the performance of the metal region 112 in combination with other metal features still to be formed in a dielectric material 131 of a further metallization layer 130. For example, a plurality of materials having a moderately high k value may be available, such as titanium oxide, tantalum oxide, perovskite oxide in the form of strontium titanate and the like, while a plurality of dielectric materials having appropriate etch stop capabilities and having a moderately low dielectric constant may be available, such as silicon carbide, silicon nitride, nitrogen-containing silicon carbide, silicon dioxide and the like. Hence, a combination of materials may be selected such that the material 122 may be selectively removed with respect to the material 121 in a later manufacturing stage, while also the material 122 may act as an efficient etch stop material with respect to the interlayer dielectric material 131. In still other illustrative embodiments, as will be explained later on in more detail, the layer stack 120 may comprise a plurality of different material layers to adjust the overall characteristics of the stack 120 with respect to etch stop capabilities and the desired high permittivity for acting as a capacitor dielectric. For example, if the metal regions 112 and 113 may require a reliable confinement, for instance when these regions comprise a significant amount of copper, respective cap layers (not shown) may be provided in a local manner at top surface areas of these metal regions 112, thereby providing increased flexibility in selecting appropriate high-k dielectric materials for the layer 121. In other cases, a dielectric cap layer, for instance in the form of silicon nitride, silicon carbide and the like, may be formed with a reduced thickness of approximately several nanometers, and then the layer 121 may be provided having the desired high dielectric constant.

The semiconductor device 100 as shown in FIG. 1a may be formed on the basis of the following processes. After forming the circuit elements 103 in the device layer 102 on the basis of well-established process techniques, a respective contact structure (not shown) may be formed, possibly in combination with additional metallization layers, if the layer 110 may not represent the very first metallization layer. Thereafter, the interlayer dielectric material 111 may be formed, for instance, by well-established deposition techniques with a subsequent patterning process for defining appropriate openings for the metal regions 112 and 113. As previously explained, contrary to conventional regimes, a respective patterning process may be performed on the basis of a respective lithography mask that may provide the desired lateral shape of the metal region 113 in connection with the regular metal region 112. Thereafter, an appropriate metal-containing material, such as copper and the like, may be filled into the openings, wherein respective barrier and seed materials may be provided, if required. For instance, according to well-established inlaid techniques of sophisticated semiconductor devices, an appropriate barrier material, such as tantalum, tantalum nitride, a combination thereof and the like, may be deposited, which may be followed by an optional deposition of a seed material. Next, copper material may be filled into the openings on the basis of electrochemical deposition techniques, after which any excess material may be removed by planarization techniques, such as etching, electrochemical etching, chemical mechanical polishing (CMP), electro-CMP and the like. As previously discussed, a conductive cap layer may be formed on top of the metal regions 112, 113, for instance by selective electrochemical deposition techniques, while, in other cases, the layer stack 120 may provide the required confinement of copper material in the regions 112, 113. For this purpose, the material 121 may be selected such that a desired confinement and also the dielectric characteristics may result in the desired performance of a capacitor still to be formed. In other cases, as will be explained later on in more detail, an appropriate cap layer with a reduced thickness may be provided followed by the deposition of the material 121 in the form of a high-k material. Next, the material 122 may be deposited as a material having respective etch stop capabilities as required for the patterning of the layer 131. For this purpose, well-established materials, as previously mentioned, may be used. Thereafter, the interlayer dielectric material of the metallization layer 130 may be deposited, which may also comprise a low-k dielectric material.

Figure 1B:
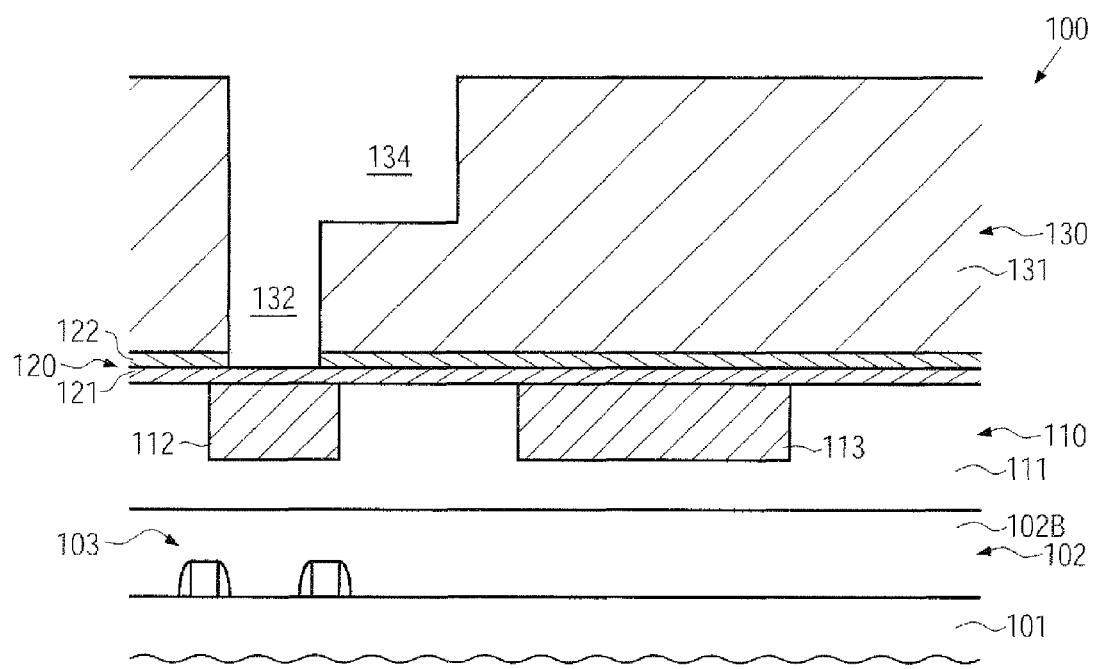

FIG. 1b schematically illustrates the semiconductor device 100 in a further advanced manufacturing stage. As shown, a first opening 132 is formed in the material 131, while, in some illustrative embodiments, a trench 134 may also be formed in an upper portion of the material 131 thereby connecting to the opening 132, which may also be referred to as a via opening. Typically, the opening 132 may have lateral dimensions so as to connect to the metal region 112, while the trench 134 may have a lateral dimension in a width direction, i.e., the horizontal direction in FIG. 1b, that is greater than the respective dimension of the opening 132 and may also have a significantly greater dimension in a length direction, i.e., the direction perpendicular to the drawing plane of FIG. 1b, compared to the via opening 132.

The openings 132, 134 may be formed in accordance with well-established inlaid techniques, for example, an etch mask may be patterned by photolithography and may be used for first forming the opening 132, thereby using the material 122 as an etch stop material for controlling the respective etch process. Thereafter, a further etch mask may be created and the trench 134 may be etched, for instance, on the basis of a time-controlled etch process. In other cases, the trench 134 may be formed first and thereafter the opening 132 may be patterned on the basis of an appropriately designed etch mask, while also using the material 122 as an etch stop material. In still other cases, an upper portion of the opening 132 may be formed on the basis of a first etch mask and the trench 134 and a second portion of the opening 132 may be formed in a common etch process using a second etch mask. Consequently, the provision of the etch stop material 122 may provide a high degree of compatibility with well-established patterning regimes for sophisticated metallization structures. Thereafter, a further etch step may be performed to remove the material 122 within the opening 132, which may be accomplished on the basis of appropriately selected etch chemistry which exhibits a certain degree of selectivity with respect to the material 121. For example, established etch chemistries on the basis of an oxygen plasma and fluorine may be used for removing the material 122 while the material 121 may provide the respective etch stop capabilities. For example, if the high-k dielectric component in the material 121 may not provide the desired etch selectivity, the layer 121 may comprise an appropriate dielectric material, such as silicon dioxide and the like, which may stop the etch process for removing the material 122 and which may be removed without unduly affecting the actual high-k dielectric material.

Figure 1C:
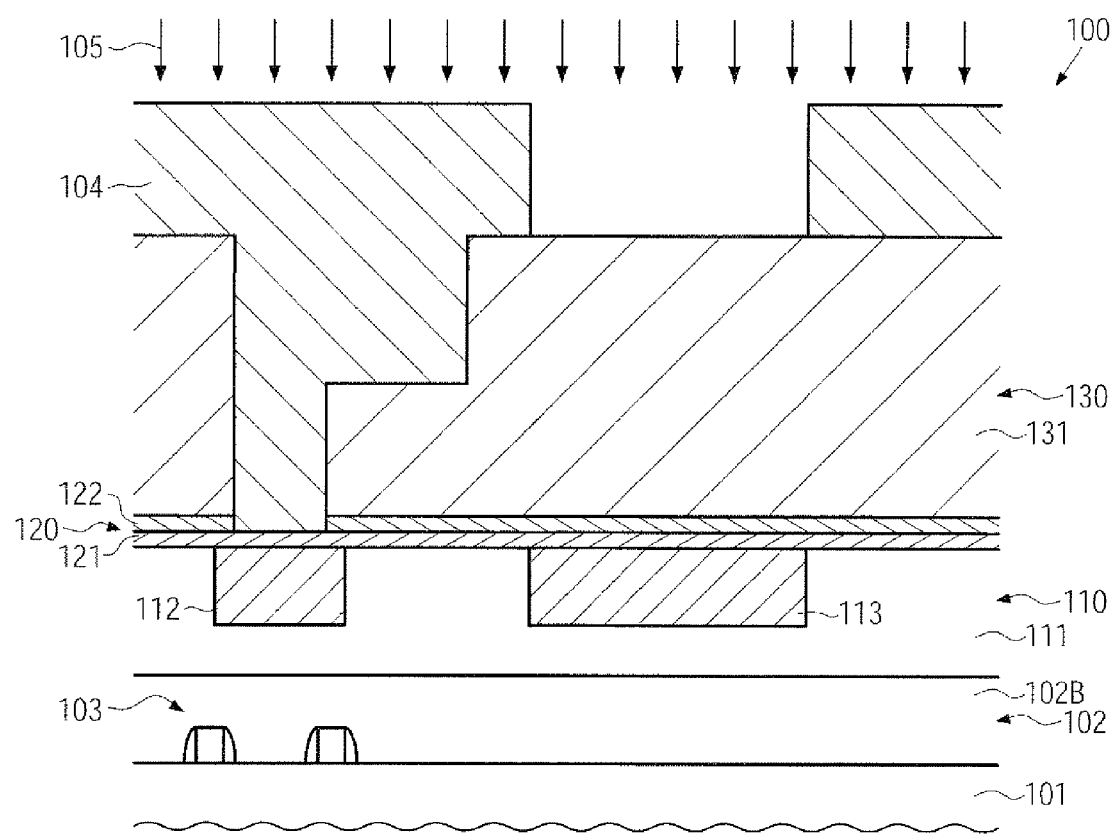

FIG. 1c schematically illustrates the semiconductor device 100 with a further etch mask 104 designed to define the lateral size of a second capacitor electrode still to be formed in the metallization layer 130, while covering the openings 132, 134. Furthermore, the device 100 may be subjected to an anisotropic etch process 105 which may be performed on the basis of process parameters that may be similar or identical to the parameters as previously used for defining the openings 132 and/or 134 in the metallization layer 110. Consequently, also in this case, well-established patterning strategies may be used, thereby providing an efficient manufacturing sequence.

Figure 1D:
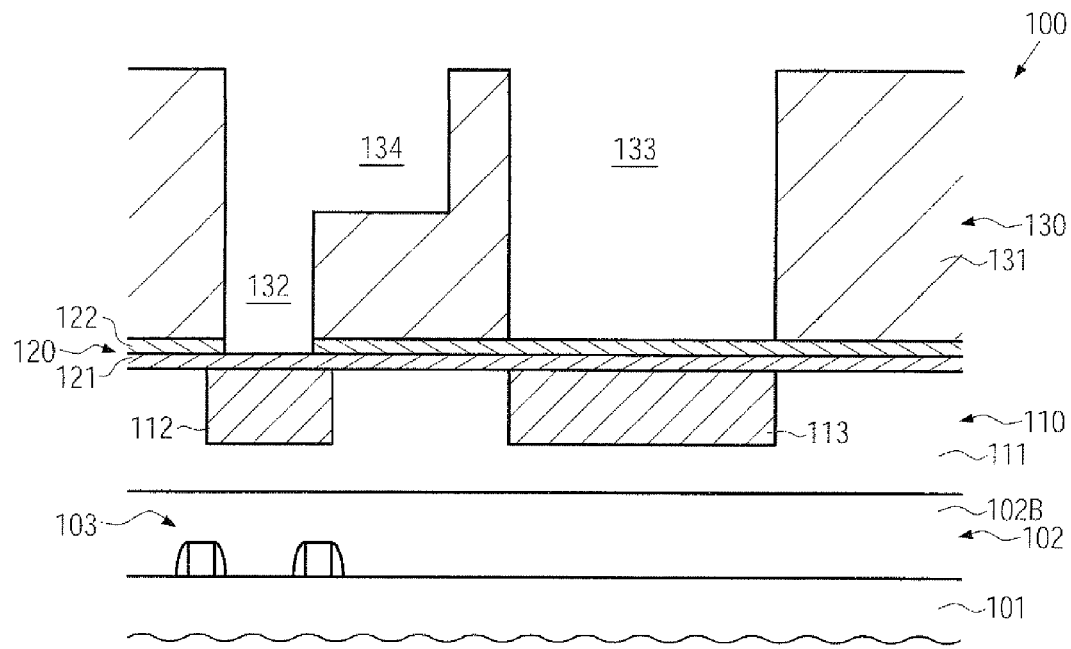

FIG. 1d schematically illustrates the device 100 in an advanced manufacturing stage in which an opening 133, which may also be referred to as a capacitor opening, is formed in the interlayer dielectric material 131 and which may extend to and possibly into the dielectric material 122, which may have acted as an etch stop material during the previously performed etch process 105. Moreover, the etch mask 104 may be removed, which may be accomplished on the basis of well-established process techniques including oxygen plasma assisted etch processes and the like. During the respective processes, the metal region 112 may be protected by the remaining portion of the layer stack 120, i.e., in the embodiment shown, by the layer 121.

Figure 1E:
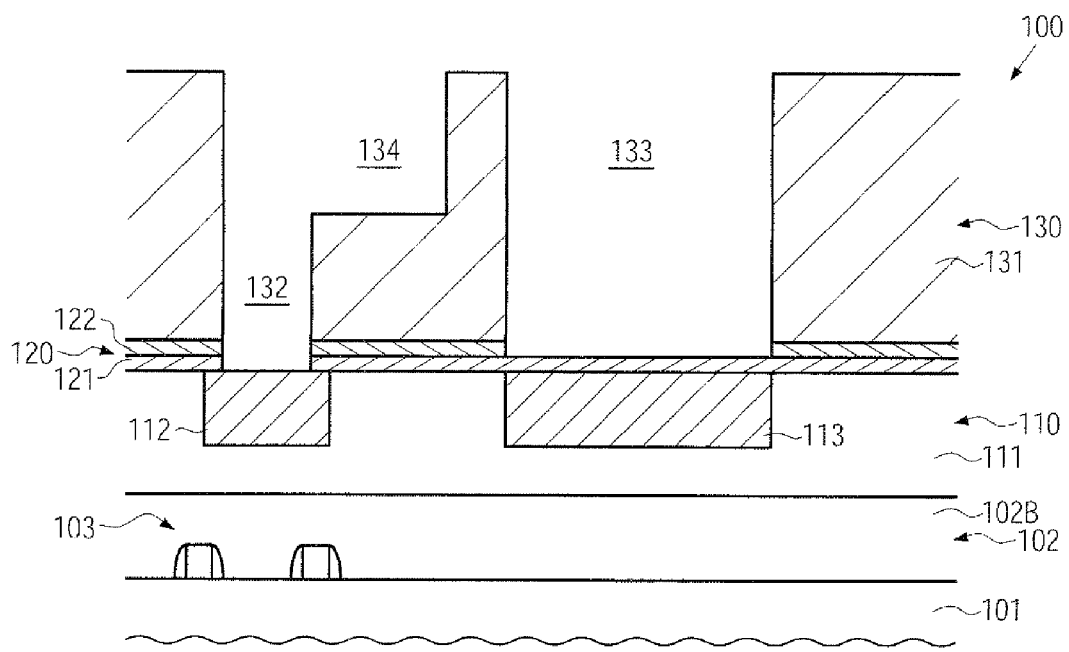

FIG. 1e schematically illustrates the semiconductor device 100 in a further advanced manufacturing stage in which the opening 132 extends to the metal region 112, while the opening 133 extends to or into the dielectric material 121, which represents a capacitor dielectric material, as previously explained. For this purpose, in one illustrative embodiment, a substantially non-selective etch process may be performed to remove the material of the layer 121 in the first opening 132 and concurrently remove material of the layer 122 in the opening 133. Since the total thickness of dielectric material in the opening 132 is significantly less compared to the total thickness of dielectric material in the opening 133, the metal region 112 may be exposed, while on the other hand a desired amount of material of the layer 121 may be reliably maintained in the opening 133. In other illustrative embodiments, the material 121 in the opening 132 may be removed on the basis of a selective etch chemistry, which may remove material of the layer 122 in the opening 133 with a significantly reduced efficiency, thereby reliably suppressing any material removal of layer 121 in the opening 133. Next, a further selective etch process may be performed to remove the material 122 selectively to the material 121 in the opening 133, thereby maintaining a well-defined thickness of the material 121 above the metal region 113. After the exposure of the metal region 112 and the removal of unwanted dielectric material in the opening 133, thereby obtaining a desired thickness of the high-k material 121, the further processing may be continued on the basis of well-established manufacturing regimes. That is, the openings 132 and 133 and also the opening 134 may be filled with an appropriate metal-containing material, such as copper and the like, wherein, if required, any conductive barrier materials may be deposited, possibly followed by the deposition of a seed material. For this purpose, well-established deposition techniques, such as sputter deposition, chemical vapor deposition (CVD), atomic layer deposition (ALD), electrochemical deposition and the like, may be used. Thereafter, any excess material may be removed on the basis of CMP, etching, electro-etching, electro-CMP and the like.

Figure 1F:
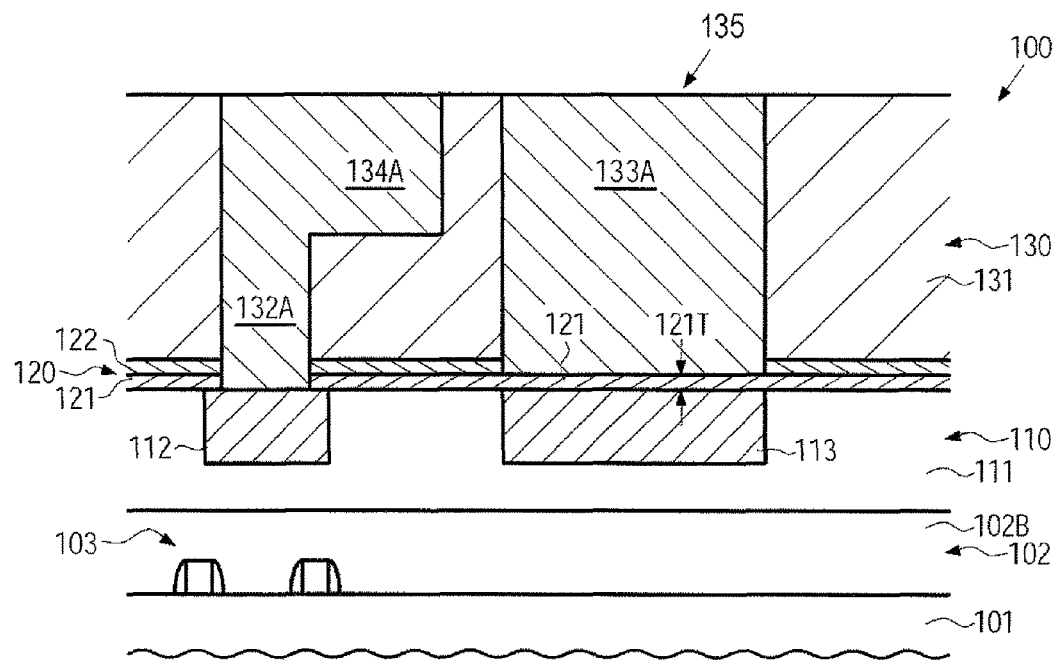

FIG. 1f schematically illustrates the semiconductor device 100 after the end of the above-described process sequence. Hence, the metallization layer 130 may comprise a via 132A connected to a metal line 134A, wherein the via 132A may provide an electrical connection between the metal region 112 and the metal line 134A. Similarly, a metal region 133A may be provided which may be separated from the metal region 113 in the lower-lying metallization layer 110 by the capacitor dielectric 121. Thus, the metal region 133A, the capacitor dielectric 121 and the metal region 113 may represent a capacitor 135, the capacitance of which may be determined by the surface area of the metal region 113 or 133A, the dielectric constant of the material 121 and the thickness 121T thereof. Thus, the moderately high dielectric constant of the material 121 may provide a moderately high capacitance in combination with a low thickness 121T which may be in the range of several nanometers to 20 or more nanometers, whereas the influence of the material 121 may be less pronounced in the vicinity of the metal region 112 and the via 132A due to a pronounced distance between the metal region 112 and the metal line 134A, which is substantially provided in the form of a low-k dielectric material of the layer 131. Consequently, based on process techniques exhibiting a high degree of compatibility with conventional strategies, the capacitor 135 may be formed with a moderately high capacitance per unit area, thereby enabling a moderately high information density for dynamic RAM areas and also enabling the provision of decoupling capacitors of high capacitance with reduced lateral dimensions. Hence, respective decoupling capacitors, such as the capacitor 135, may be efficiently positioned at appropriate circuit nodes while also complying with design requirements of critical device areas, such as complex logic blocks, which may contain a plurality of fast switching transistor elements.

Figure 2A:
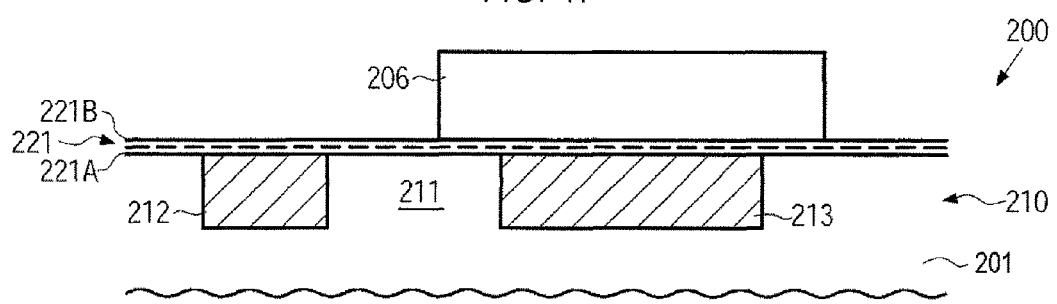
FIGS. 2a-2c schematically illustrate cross-sectional views during various manufacturing stages in forming a capacitor in a metallization structure using an etch stop layer stack formed above a first metallization layer and having a different configuration in different device areas so as to reduce any effect of high-k dielectric materials that may be used as a capacitor dielectric, according to further illustrative embodiments.
Figure 2B:
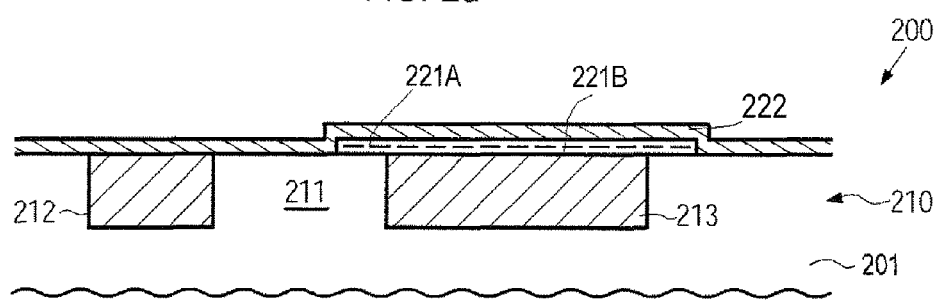
Figure 2C:
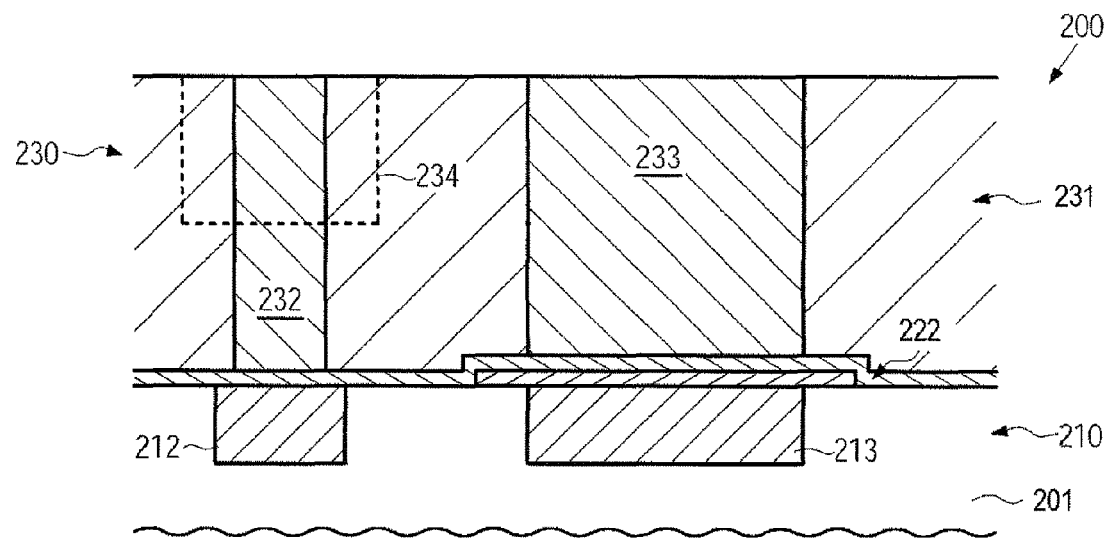

With reference to FIGS. 2a-2c, further illustrative embodiments will now be described in which a dielectric layer stack including a plurality of etch stop layers may be patterned such that the capacitor dielectric material having a moderately high permittivity may be positioned in the vicinity of the capacitor to further reduce an influence on other device areas, in which a moderately low overall permittivity of the dielectric material including metal features may be desired.

FIG. 2a schematically illustrates a cross-sectional view of a semiconductor 200 comprising a substrate 201 having formed thereabove a metallization layer 210. It should be appreciated that the device 200 may also comprise a device level formed above the substrate 201, which may have a configuration as previously explained with reference to the device 100. For convenience, any such semiconductor-based circuit elements are not shown in FIG. 2a. The metallization layer 210 may have a similar configuration as previously discussed. That is, a dielectric material 211, for instance in the form of a low-k dielectric material, may include a plurality of metal features, such as a metal region 212, representing, for instance, a metal line for connecting various circuit elements, as previously discussed. Furthermore, a metal region 213 may be provided which may represent a first electrode of a capacitor still to be formed. For example, the metal regions 212 and 213 may comprise a highly conductive metal, such as copper and the like, possibly in combination with a barrier material, as previously explained. Furthermore, in the manufacturing stage shown, one or more dielectric materials 221 may be formed on the dielectric material 211 and the metal regions 212, 213. As previously explained, in some cases, the metal regions 212, 213 may require a confinement at a top surface thereof, which may be provided in the form of a conductive cap material, while, in other cases, a dielectric cap layer may be provided, for instance, in the form of an appropriate material 221A, which may represent a part of a dielectric material 221. For example, silicon nitride, silicon carbide, nitrogen-enriched silicon carbide and the like may be used for this purpose. Moreover, at least one further dielectric material 221B may be provided, which may have a desired high dielectric constant to provide an increased capacitance of the capacitor still to be formed. For this purpose, any appropriate high-k dielectric materials may be used, which may be compatible with the further processing of the device 200. For example, a plurality of dielectric materials having a high dielectric constant may be formed on the basis of appropriate deposition techniques at moderately low temperatures, that is, at temperatures of approximately 500° C. and less, thereby not unduly affecting the characteristics of the device 200. In other cases, when the high-k dielectric material itself may provide sufficient confinement abilities or when the metal regions 212 and 213 may have appropriately designed conductive cap layers, the material 221A may be omitted and the dielectric material 221B may be directly formed on the dielectric material 211 and the metal regions 212 and 213.

Furthermore, in the manufacturing stage shown, an etch mask 206 may be formed to define the lateral size and position of the dielectric material 221. That is, the etch mask 206 may cover an area of appropriately selected size in the vicinity of the metal region 213 in order to restrict the presence of the high-k dielectric material 221 to the vicinity of the metal region 213. It should be appreciated that the etch mask 206, which may be comprised in the form of a resist material and the like, may cover certain device areas, such as dynamic RAM areas, when a plurality of capacitor electrodes 213 may be present in the device area under consideration. In other cases, each of the capacitor electrodes 213 and its immediate neighborhood may be covered by a respective etch mask 206, wherein a certain "excess width" of the etch mask may provide less constraints with respect to overlay accuracy during the patterning process for forming the etch mask 206. Hence, the presence of a high-k dielectric material may be substantially restricted to the neighborhood of the metal region 213, even if the capacitor electrode 213 is surrounded by a plurality of other metal components, such as the metal region 212.

The semiconductor device 200 as shown in FIG. 2a may be formed on the basis of similar process techniques as previously described with reference to the device 100. That is, after forming respective circuit elements (not shown) and forming the metallization layer 210, including the metal regions 212 and 213, the dielectric material 221 may be deposited on the basis of any appropriate deposition technique, such as CVD, sputter deposition, ALD and the like. Thereafter, the etch mask 206 may be provided by lithography techniques and the device 200 may be subjected to an appropriately designed etch process for removing the exposed part of the dielectric material 221 or at least the exposed portion of the material 221B, when an exposure of the metal region 212 may not be desired. For example, a wet chemical etch recipe or a plasma assisted etch process may be used, at least removing the exposed part of the dielectric material 221B while, if provided, the material 221A may act as an etch stop material. For example, silicon carbide may have a high etch resistivity with respect to a plurality of wet chemical etch recipes and therefore any appropriate chemistry may be used for selectively removing the portion 221B.

FIG. 2b schematically illustrates the device 200 with a further dielectric material 222 which may represent an etch stop material for patterning dielectric material of a metallization layer still to be formed. For this purpose, any appropriate material, such as silicon dioxide, silicon oxynitride, silicon carbide, silicon nitride, nitrogen-containing silicon carbide and the like, may be used. If the optional dielectric material 221A may have been provided, the material 222 and the optional material 221A may, in combination, provide the desired characteristics for providing the etch stop capabilities, possibly in combination with adhesion characteristics and an overall moderately low permittivity in view of the metal region 212. That is, as previously explained, the material 221A, if provided, may act as an efficient cap layer and may thus also determine the overall performance of the metal region 212, for instance with respect to electromigration and the like. The material 222 may be formed on the basis of any appropriate deposition technique, for instance using well-established recipes.

FIG. 2c schematically illustrates the semiconductor device in a further advanced manufacturing stage. As illustrated, a dielectric material 231 of a further metallization layer 230 is formed above the metallization layer 210 and may comprise a first opening or via opening 232 and a second or capacitor opening 233. In some illustrative embodiments the openings 232, 233 may be formed in a common etch process, in which the material 222 may act as an efficient etch stop material. In still other cases, a trench 234 may be formed in a common process sequence with the openings 232, 233, as previously explained. For this purpose, well-established inlaid pattering regimes may be used, thereby providing an efficient overall process flow.

Figure 2D:
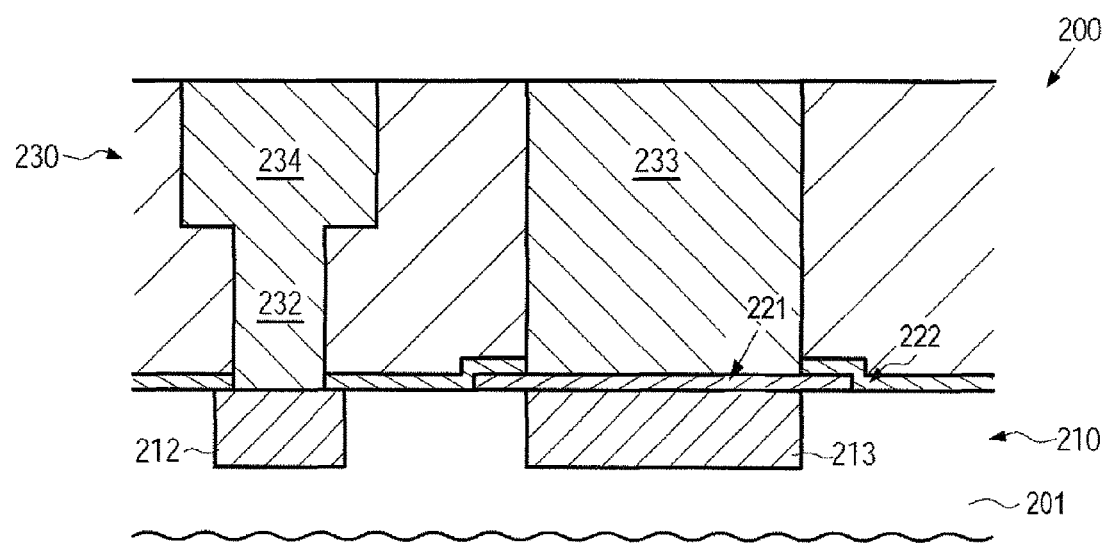
FIG. 2d schematically illustrates a semiconductor device according to further illustrative embodiments, in which an etch stop layer stack may be provided with a plurality of different materials.

FIG. 2d schematically illustrates the device 200 in a further advanced manufacturing stage in which the trench 234 is provided so as to connect to the via opening 232 and also the etch stop material 222 may be removed within the openings 232 and 233. This may be accomplished on the basis of a selective etch process in which the material 222 may be selectively removed with respect to the material 221. It should be appreciated that, in some illustrative embodiments, as previously explained, the material 222 may comprise an additional liner formed on the material 221 followed by the bulk material of the layer 222, if the high-k portion 221 may not provide the desired high etch selectivity. Hence, in a respective etch sequence, the main portion of the material 221 may be removed selectively to the liner material, which may then be removed in a short wet or dry chemical etch process, which may not unduly affect the underlying high-k dielectric material in the opening 233. For example, a thin silicon dioxide liner material may be used in combination with a silicon carbide material or a silicon nitride material in the layer 222. Next, the further processing may be continued, as previously described with reference to the device 100, i.e., the openings 232, 234 and 233 may be filled with a metal-containing material in accordance with well-established dual damascene strategies, thereby forming a respective capacitor electrode in the opening 233 which may, in combination with the material 221 and the electrode 213, define a respective capacitor, as previously discussed.

Figure 3A:
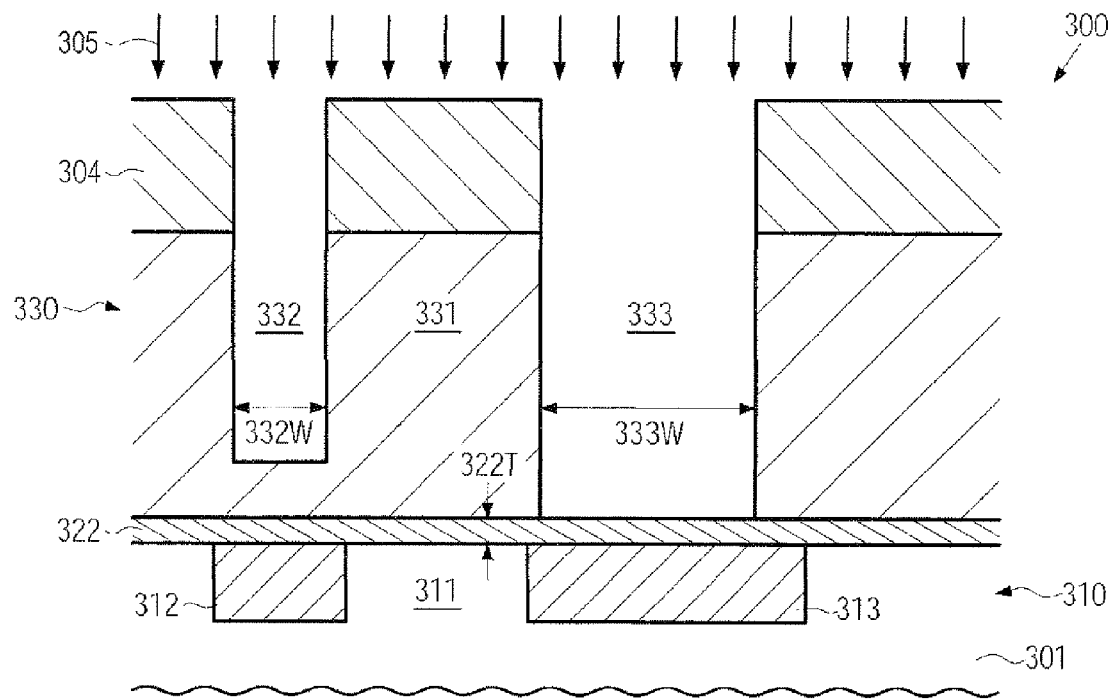
FIGS. 3a-3c schematically illustrate cross-sectional views of a semiconductor device during various manufacturing stages in forming a via opening and a capacitor opening in a common process sequence, according to still further illustrative embodiments.
Figure 3B:
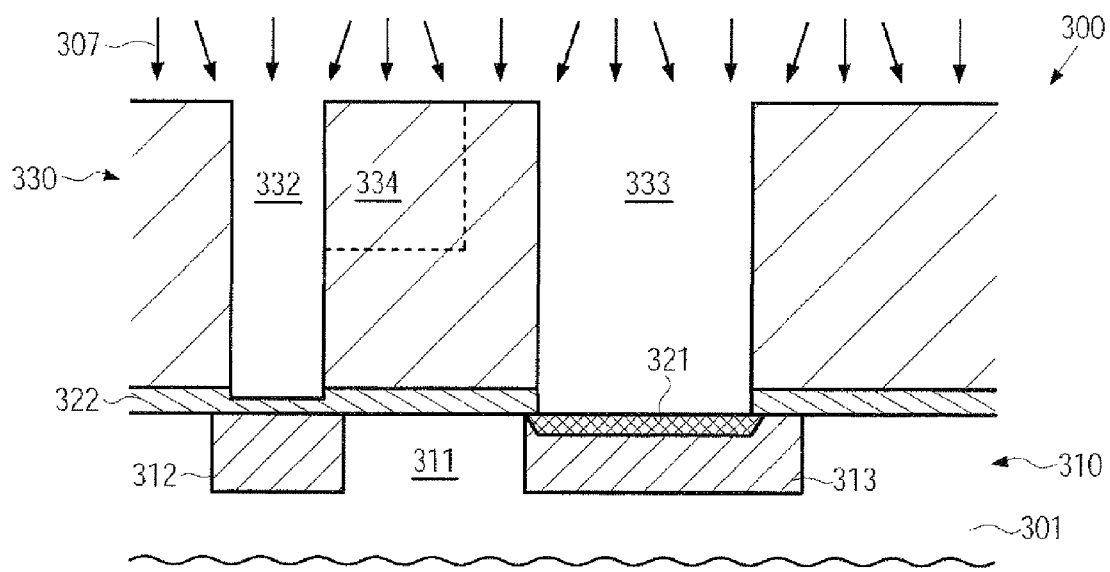
Figure 3C:
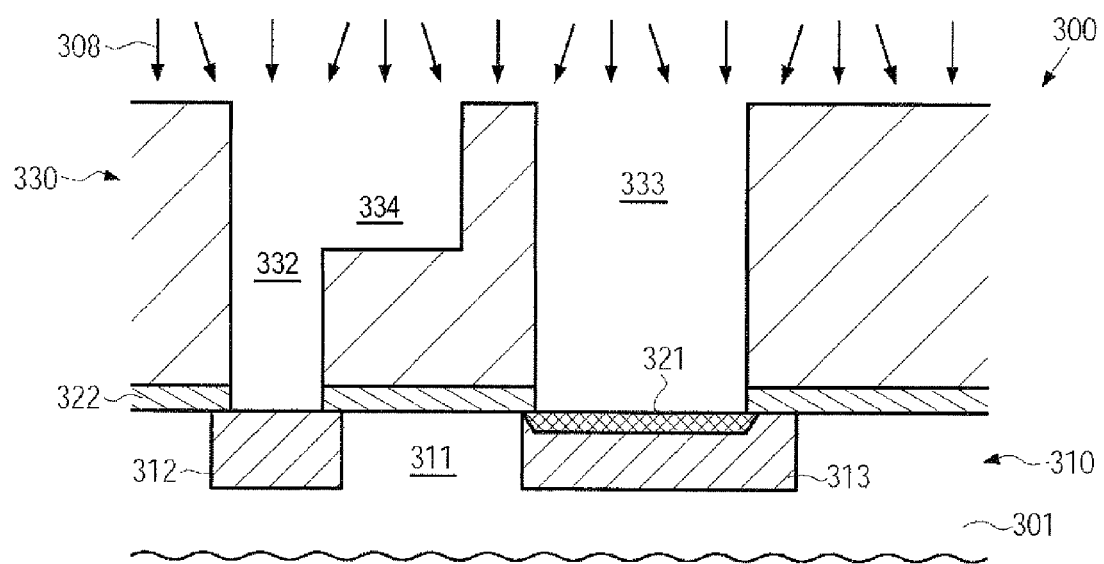

With reference to FIGS. 3a-3c, further illustrative embodiments will now be described, in which a self-aligned capacitor dielectric may be formed without requiring additional photolithography steps.

FIG. 3a schematically illustrates a semiconductor device 300 in an advanced manufacturing stage. As illustrated, the device 300 may comprise a substrate 301 having formed thereabove a first metallization layer 310, wherein further metallization layers may be formed between the substrate 301 and the metallization layer 310, as previously described. Furthermore, a device layer (not shown) may be provided and may comprise respective circuit elements, as is also described with reference to the device 100. The metallization layer 310 may comprise a dielectric material 311, for instance in the form of a low-k dielectric material, and metal regions 312, 313 having the characteristics as previously described with reference to the devices 100 and 200. Furthermore, an etch stop layer 322 may be formed on the metallization layer 310, wherein the etch stop material 322 may be provided in the form of any appropriate material, such as silicon nitride, silicon carbide and the like. Furthermore, a further metallization layer 330 in an early manufacturing stage is formed above the first metallization layer 310 and may comprise a first opening 332, that is, a via opening, and a second opening 333. The via opening 332 may have lateral dimensions in both lateral directions, i.e., in the horizontal direction and in a direction perpendicular to the drawing plane of FIG. 3a, which may be significantly less compared to the lateral dimensions of the opening 333, which is to represent the lateral dimensions of a capacitor electrode. For example, the lateral dimensions in both directions of the via opening 332 may be in the range of 100 nm and less to several hundred nanometers, whereas the opening 333 may have dimensions of several hundred nanometers to several micrometers, at least in a length direction, i.e., a direction perpendicular to the drawing plane, while also a width 333W of the opening 333 may be greater than a width 332W of the opening 332.

Moreover, the device 300 may comprise an etch mask 304, for instance comprising resist material, a hard mask material and the like, to define the openings 332 and 333 during an anisotropic etch process 305. The semiconductor device 300 may be formed in accordance with process techniques as previously described. That is, after forming the metallization layer 310, the dielectric material 322 may be formed with an appropriate thickness 322T to act as an efficient etch stop material for the opening 332, while allowing a significant material removal in the opening 333 due to increased removal etch rate caused by the different lateral dimensions and thus by the different local etch conditions compared to the opening 332. Thereafter, the dielectric material 331 may be formed on the basis of well-established techniques and subsequently the etch mask 304 defining the openings 332, 333 may be provided on the basis of well-established process techniques. Next, the etch ambient 305 may be established by, for instance, using anisotropic etch recipes as are typically used in advanced patterning regimes for sophisticated metallization structures. During the anisotropic etch process 305, the etch conditions may typically be adjusted on the basis of type of reactive gas components, carrier gases, the pressure, the temperature and the amount of polymer components which may be used for adjusting a degree of anisotropic behavior in accordance with a physical component in the form of a particle bombardment obtained by a respective bias voltage applied between the etch ambient and the substrate 301 and the like. Due to the very different lateral dimensions, the etch rate in the openings 332 and 333 may be different, in particular with increasing etch depth due to micro loading effects, as is well known in the art. Consequently, the etch depth may be different at a final phase of the etch process 305 so that, in the stage shown, the etch process 305 may increasingly attack an exposed portion of the etch stop material 322, while the etch front may not have yet reached the material 322 in the opening 332. Consequently, a significant amount of material removal may occur in the opening 333, thereby reducing the thickness 332T or even completely exposing the metal region 313. In other illustrative embodiments, the etch process 305 may comprise a further etch step after the opening 332 has been etched to and into the etch stop layer 322, which may be performed on the basis of an etch chemistry for further reducing material of the etch stop layer 322, thereby exposing the material 313, while still covering the metal region 312.

In still other illustrative embodiments, after the etch process 305, a further etch mask may be formed to define a trench opening in accordance with well-established damascene strategies, while the openings 332, 333 may be filled with an appropriate material, such as resist material, polymer material and the like. Thereafter, a trench opening may be formed and the polymer material or resist material may be removed from the openings 332, 333. During a respective etch process, a reduction in thickness of the etch stop material 322 may also be accomplished in the opening 332, for instance by oxygen plasma assisted etch processes, possibly in combination with a certain amount of fluorine as a further reactive component. During this etch process, the material 322 may be substantially completely removed above the metal region 313, which may therefore be exposed, while the region 312 may still be covered by a certain amount of the etch stop material 322.

FIG. 3b schematically illustrates the device 300 in a further advanced manufacturing stage in which the opening 322, possibly in combination with a trench 334, are formed so that the metal region 312 is still covered by material of the layer 322, while the metal regions 313 may have been exposed, as explained above. Furthermore, the device 300 may be subjected to a treatment 307 for locally forming a dielectric material 321 on the exposed portion of the metal region 313. In one illustrative embodiment, the treatment 307 may comprise an oxidation process performed at appropriate temperatures and/or on the basis of an appropriately selected oxidizing ambient, which could be a wet chemical ambient for performing a wet chemical oxidation, a plasma assisted ambient and the like. For example, the metal region 313 may be comprised of copper, which may be efficiently converted into copper oxide on the basis of a plurality of wet and dry chemical oxidation ambients, thereby forming a continuous copper oxide layer of a specified thickness of, for example, 5-20 nm, depending on the process parameters of the treatment 307. Consequently, a dielectric material in the form of copper oxide may be provided, which may have a dielectric constant of approximately 18. On the other hand, the remaining material 322 in the opening 332 may efficiently avoid any undue reaction of the ambient 307 with the metal region 312.

In still other illustrative embodiments, the treatment 307 may comprise a highly "anisotropic" deposition of a dielectric material, wherein the deposition rate on horizontal portions may be increased compared to the deposition rate for substantially vertical sidewall portions in the openings 333 and 332. Furthermore, the overall deposition rate in the opening 332 having the reduced lateral dimensions compared to the opening 333 may in total be less compared to the opening 333. Since the presence of a high-k dielectric material at sidewalls of the openings 332 and 333 may be less desirable, a subsequent etch process may be performed to remove material of the previously deposited dielectric material so as to substantially completely remove the high-k dielectric material from sidewall portions of the openings 333 and 332, while still maintaining, due to the increased thickness at the bottom of the opening 333, the material 321. On the other hand, the material 321 may be substantially completely removed from the opening 332.

FIG. 3c schematically illustrates the device 300 in a further advanced manufacturing stage in which a further etch process 308 performed, for instance, after forming the trench opening 334 and removing any resist material or polymer material which may have been used to fill the openings 332 and 333 during forming the trench 334 on the basis of a respective etch mask. For example, the etch process 308 may comprise a plasma assisted etch process using an oxygen plasma, possibly in combination with a fluorine component, to expose the metal region 312 in the opening 332, while the material 321 may act as an efficient etch stop material, wherein a thickness of the material 321 may have been selected such that a desired remaining thickness may still be obtained, even if a material removal during the process 308 may occur. Thereafter, the further processing may be continued on the basis of well-established techniques, i.e., the deposition of barrier materials, if required, a seed material and the electrochemical deposition of a copper material or any other highly conductive metal. Thus, also in this case, a capacitor may be formed, as previously explained, wherein the capacitance thereof is substantially defined by the lateral size of the opening 333 and the type and thickness of the dielectric material 321. Moreover, due to the self-aligned nature of the dielectric material 321, the capacitor may be formed on the basis of a manufacturing flow having a high degree of compatibility with conventional strategies without requiring additional photolithography steps.

As a result, the principles disclosed herein provide semiconductor devices and manufacturing techniques for forming metal capacitors in the metallization structure of a semiconductor device on the basis of appropriately selected etch stop materials, one of which may be used as a capacitor dielectric. Consequently, the capacitor electrodes may be formed on the basis of well-established manufacturing processes without unduly contributing to overall process complexity. In some illustrative embodiments, additional photolithography steps may be avoided, thereby further enhancing the overall process efficiency. Hence, storage elements for dynamic RAM areas, decoupling capacitors, capacitors for analog circuitries and the like may be efficiently positioned in the metallization system of the semiconductor device, thereby avoiding highly complex manufacturing sequences in the device level, while also contributing to a reduced consumption of die area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an etch stop layer stack above first and second metal regions of a first metallization layer formed above a semiconductor device, said etch stop layer stack comprising a first etch stop layer and a second etch stop layer;
    forming an interlayer dielectric material above said etch stop layer stack;
    forming a first opening in said interlayer dielectric material above said first metal region, said first opening extending through said first and second etch stop layers of said etch stop layer stack;
    forming a second opening in said interlayer dielectric material above said second metal region, said second opening extending through said second etch stop layer to said first etch stop layer; and
    filling said first and second openings with a metal-containing material in a common fill process.

2. The method of claim 1, wherein forming said first and second openings comprises etching said first opening through said interlayer dielectric material and said second etch stop layer using said first etch stop layer as an etch stop and subsequently etching said second opening through said interlayer dielectric material using said second etch stop layer as an etch stop.

3. The method of claim 2, wherein forming said first and second openings further comprises removing said first etch stop layer in said first opening and said second etch stop layer in said second opening in a common etch process.

4. The method of claim 2, wherein forming said first and second openings further comprises removing said first etch stop layer in said first opening in a first etch process and removing said second etch stop layer selectively to said first etch stop layer in said second opening in a second etch process.

5. The method of claim 1, wherein forming said etch stop layer stack comprises forming said first etch stop layer as a first dielectric material having a first permittivity and forming said second etch stop layer as a second dielectric material having a second permittivity above said first etch stop layer.

6. The method of claim 5, wherein said second permittivity is less than said first permittivity.

7. The method of claim 1, wherein forming said etch stop layer stack comprises forming at least one further dielectric layer having a permittivity greater than a permittivity of said first and second etch stop layers.

8. The method of claim 1, further comprising forming a trench in an upper portion of said interlayer dielectric material, said trench connecting to said first opening.

9. The method of claim 1, wherein at least one lateral dimension of said second metal region is greater than at least one lateral dimension of said first metal region.

10. A method for forming a capacitive structure in a metallization structure of a semiconductor device, the method comprising:
    forming a via opening and a capacitor opening in a dielectric layer by performing a first etch process;
    controlling at least one process parameter of said first etch process to stop material removal in said via opening on the basis of an etch stop layer while substantially completely removing said etch stop layer in said capacitor opening to expose a capacitor electrode;
    forming a dielectric material on an exposed surface of said capacitor electrode;
    removing said etch stop layer in said via opening to expose a metal region; and
    filling said via opening and said capacitor opening with a metal-containing material in a common process sequence.

11. The method of claim 10, wherein forming said dielectric material comprises performing a surface treatment to convert a surface portion of said capacitor electrode into said dielectric material.

12. The method of claim 11, wherein said surface treatment comprises performing an oxidation process.

13. The method of claim 10, further comprising forming a trench in an upper portion of said dielectric layer, wherein said trench connects to said via opening.

14. The method of claim 10, wherein said exposed capacitor electrode comprises copper.

15. The method of claim 10, wherein any lateral dimension of said capacitor opening is greater than any lateral dimension of said via opening.

16. The method of claim 10, wherein forming said dielectric material comprises depositing said dielectric material at least on said exposed surface of said capacitor electrode.

17. The method of claim 10, wherein said at least one process parameter of said first etch process comprises one of a reactive gas component, a carrier gas, a pressure, a temperature, and an amount of polymer components.

* * * * *